United States Patent [19]

Frieser et al.

[11] 4,350,578

[45] Sep. 21, 1982

[54] CATHODE FOR ETCHING

[75] Inventors: Rudolf G. Frieser, Poughkeepsie; William H. Ma; Gunars M. Ozols, both of Wappingers Falls; Bryant N. Zingerman, Monroe, all of N.Y.

[73] Assignee: International Business Machines Corporation, Armonk, N.Y.

[21] Appl. No.: 262,020

[22] Filed: May 11, 1981

[51] Int. Cl.³ .......................................... C23C 15/00
[52] U.S. Cl. ......................... 204/192 R; 204/192 D; 204/192 E; 204/298
[58] Field of Search ............... 204/298, 192 D, 192 E, 204/192 EC, 192 R

[56] References Cited

U.S. PATENT DOCUMENTS 4,153,528  5/1979  Dykeman et al. ................. 204/298

FOREIGN PATENT DOCUMENTS 52-68284  6/1977  Japan ..................................... 21/302

OTHER PUBLICATIONS

IBM Technical Disclosure Bulletin, vol. 18, No. 3, Aug. 1975, p. 810; and vol. 19, No. 10, Mar. 1977, p. 3854.

Primary Examiner—Veronica O'Keefe
Attorney, Agent, or Firm—Joseph E. Kieninger

[57] ABSTRACT

A cathode for reactive ion etching is provided which improves the etch rate and the uniformity of etching on the object etched. The cathode has a quartz plate with a series of recesses having disks therein of the same material as the object to be etched and a ring of that same material around the outer edge of the plate. In a preferred embodiment a cathode for etching silicon wafers has silicon disks recessed in a quartz plate at each wafer holding position and a ring of silicon around the outer edge of the plate.

6 Claims, 4 Drawing Figures

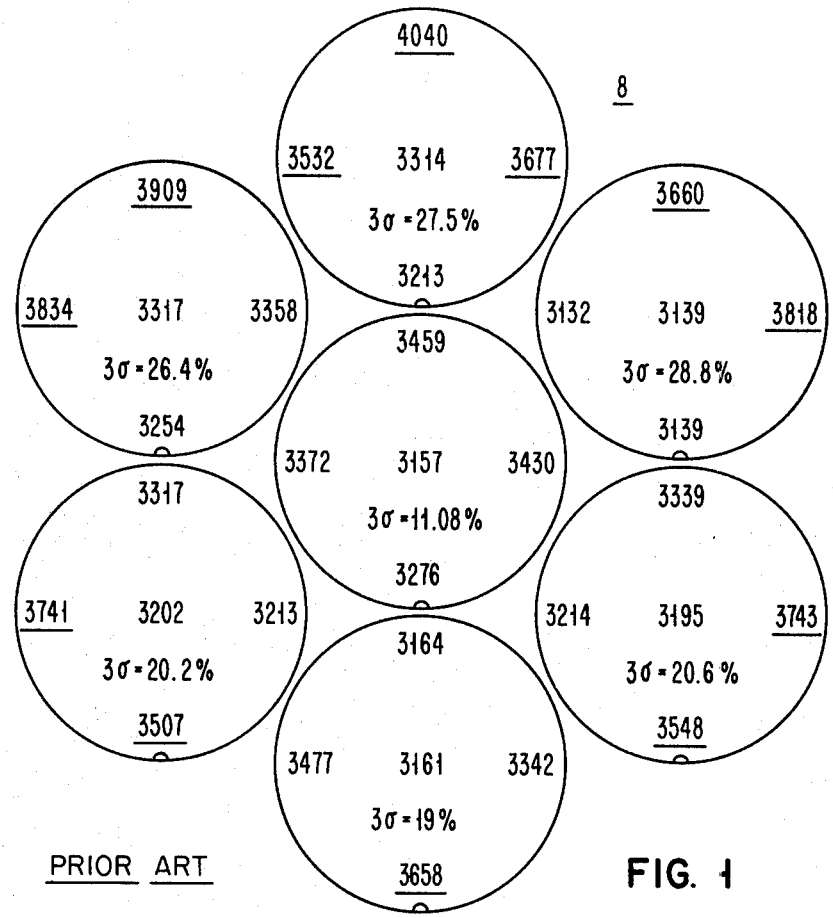
PRIOR ART
FIG. 1
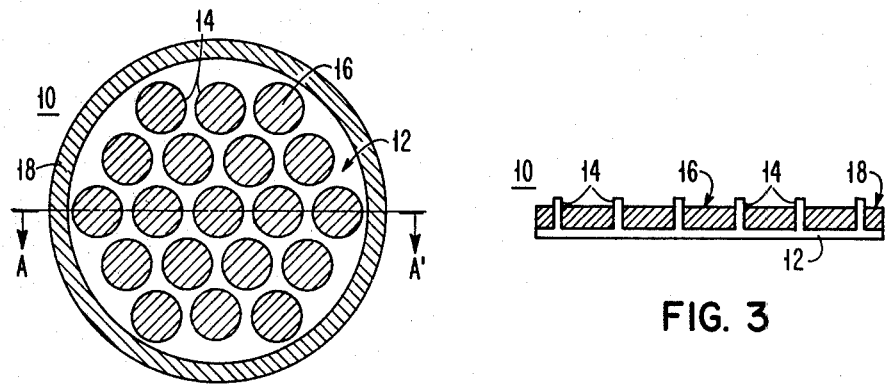
FIG. 2
FIG. 3

CATHODE FOR ETCHING

DESCRIPTION

1. Technical Field

This invention relates to reactive ion etching and more particularly to a cathode for use in reaction ion etching.

It is a primary object of this invention to provide an improved cathode for reactive ion etching.

It is another object of this invention to provide a cathode for the reactive ion etching of silicon.

It is still another object of this invention to provide a cathode which improves the silicon etch rate.

It is yet still another object of this invention to provide a cathode which improves the uniformity in the etching of silicon wafers.

2. Background Art

The etch rate of a given material such as silicon is greatly affected by the type of cathode material used. For example, using the same reactor, a cathode made of silicon will etch polysilicon at a rate of 160 A/minute. A quartz cathode, on the other hand, will result in an etch rate of polysilicon of 450 A/minute. Since the etching rate using a quartz cathode is substantially higher than that using a silicon cathode, and since a silicon cathode is expensive, a quartz electrode has several advantages.

However, there are disadvantages in using a quartz electrode. One disadvantage is the lack of uniformity in the etching rate among a plurality of wafers positioned on the cathode. The etch rate is fastest at the outermost edge of the outer wafers, that is, those wafers furtherest away from the center of the cathode.

As shown in FIG. 1, a plurality of silicon wafers positioned to form a hexagonal pattern on a prior art quartz cathode were reactive ion etched in a $SF_6/CCl_4/He$ was mixture. The etch depth values in angstroms are written at the center and at four locations around the outer edge of the wafer. The etching non-uniformity value, $3\sigma$, is shown for each wafer and varies from 11.08% to 28.8%. The $3\sigma$ non-uniformity value for the whole group of wafers is 21.8%. This data shows the lack of etching uniformity and the faster etch rate at the outermost edge of the outer wafers.

Numerous systems have been developed to improve the uniformity of etching. For example, in the Japanese patent application No. 52-68284, a jig of aluminum is described in which silicon wafers are positioned against a number of silicon plates that project out from the aluminum jig. Another approach is described in the IBM Technical Disclosure Bulletin Vol. 18, No. 5, August 1975 page 810 in which the use of quartz dummy wafers in the first and last position of a wafer boat is reported to reduce the variability in the plasma etch rate as a function of position in the wafer boat.

DISCLOSURE OF THE INVENTION

For a further understanding of the invention and the objects and advantages thereof, reference will be had to the following description and the accompanying drawings and to the appended claims in which the various novel features of the invention are more particularly set forth.

Accordingly, a cathode for reactive ion etching is provided which improves the etch rate and the uniformity of etching on the object etched. In a preferred embodiment, a cathode for etching silicon wafers has silicon disks recessed in a quartz plate at each wafer holding position and a ring of silicon around the outer edge of the plate. In another embodiment, a cathode for etching silicon wafers has carbon disks recessed in a quartz plate at each wafer holding position and a ring of carbon around the outer edge of the plate. In general, the cathode has a quartz plate and the ring and disks are made, preferably, of the material to be etched. The ring and disks may be made of Si, Cr, C, W, Ti, Al and Mo when these materials, respectively, are being etched.

BRIEF DESCRIPTION OF THE DRAWINGS

FIG. 1 shows the etch depth of silicon wafers etched with a prior art cathode.

FIG. 2 is a top view of the cathode design in accordance with this invention.

FIG. 3 is a cross-sectional view of the cathode shown in FIG. 2 along the Section A-A'.

BEST MODE FOR CARRYING OUT THE INVENTION

Figure 4:
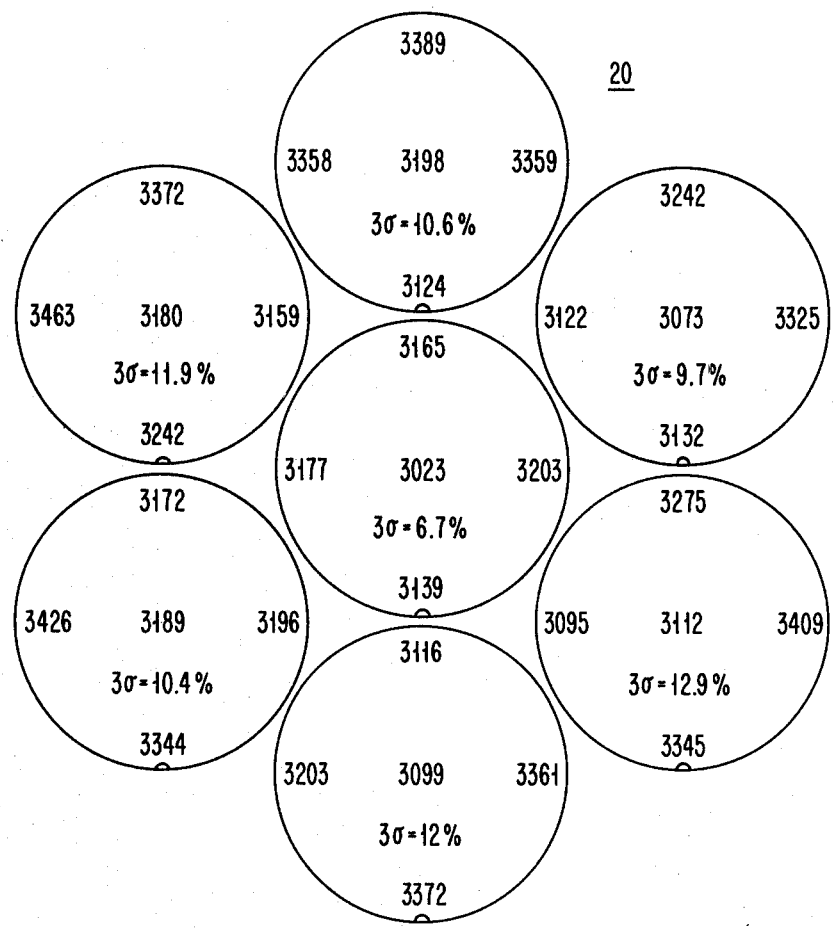
FIG. 4 shows the etch depth of silicon wafers etched with a cathode in accordance with this invention.

An example of a cathode suitable for the reactive ion etching of silicon is shown in FIGS. 2 and 3 where a plate 12 has a plurality of recesses 14 therein that retain the silicon wafers (not shown) in their position during the etching process. In a preferred embodiment the plate 12 is made of quartz. Other materials that may be used are silicon and aluminum.

In each of the recesses 14 is positioned a disk 16 which is slightly thinner than the depth of the recess. A preferred material for the disk 16 is silicon when silicon wafers are to be etched. The disks 16 can be the same size or slightly larger or wider than the wafers that are etched. Another material suitable for the disk 16 when etching silicon is glassy carbon.

The cathode 10 includes a ring 18 around the outermost portion of the plate 12. The preferred material for the ring 18 when etching silicon wafers is silicon. Glassy carbon may also be used when etching silicon.

When materials other than silicon are to be etched, the disk 16 and the ring 18 are made of that same material that is etched. For example, if chromium is to be etched, then the disk 16 and ring 18 are made of chromium, Similarly, when aluminum, tungsten, titanium or molybdenum are etched, the disk 16 and ring 18 are made of the same material being etched in order to eliminate any etch rate variation due to the loading effect.

The cathode design shown in FIGS. 2 and 3 improves the etch uniformity of silicon wafers. This cathode provides the advantages of a silicon cathode, while at the same time being much less expensive than a silicon cathode.

EXAMPLE

As shown in FIG. 4, a plurality of silicon wafers 20 were positioned to form a hexagonal pattern on a cathode (not shown) made in accordance with this invention and similar to FIGS. 2 and 3. The wafers 20 were then etched in a $SF_6CCl_4/He$ gas mixture under conditions identical, except for the cathode, to the wafers shown in FIG. 1. The etch depth in angstroms is written at the center and at four locations around the outer edge of the wafer. The etching uniformity, $3\sigma$, is shown for each wafer and varies from 6.7% to 12.9%. The $3\sigma$ uniformity value for the whole group of wafers is 10.9%, which is substantially lower than the $3\sigma$ uniformity value of 21.8% obtained with the prior art cathode shown in FIG. 1.

While we have illustrated and described the preferred embodiments of our invention, it is understood that we do not limit outselves to the precise steps herein and the right is secured to all changes and modifications coming within the scope of the invention as defined in the appended claims.

We claim:

1. In a process for reactive ion etching workpieces that are supported in a plurality of recesses formed in one face of a quartz plate cathode, the improvement comprising:

1. placing disks made of the same material as the workpiece to be etched in each of said recesses so that the disks are below the level of said face and larger than the workpiece, and 2. placing a border of the same material as the workpiece around the outer edge of the quartz plate cathode.

2. In a process for reactive ion etching workpieces that are supported in a plurality of recesses formed in one face of a quartz plate cathode, the improvement comprising:

placing disks of a material taken from the group consisting of Si, C, Al, W, Cr, Ti, and Mo in each of said recesses so that the disks are below the level of said faces and larger than the workpiece, and placing a border of a material taken from the group consisting of Si, C, Al, W, Cr, Ti and Mo around the outer edge of the quartz plate cathode.

3. A process as described in claim 2 whereby the disk is made of silicon.

4. A process as described in claim 2 whereby the border is made of silicon.

5. A process as described in claim 2 wherein the disk is made of carbon.

6. A process as described in claim 2 whereby the border is made of carbons.

* * * * *